(12) United States Patent
Bamberger et al.

(10) Patent No.: US 11,733,305 B2
(45) Date of Patent: Aug. 22, 2023

(54) METHOD, COMPUTER-IMPLEMENTED TOOL AND BATTERY MANAGEMENT SYSTEM FOR ESTIMATING STATES OF HEALTH OF BATTERIES STORING ELECTRICAL ENERGY AND BATTERY ENERGY STORAGE SYSTEM

(71) Applicant: Siemens Aktiengesellschaft, Munich (DE)

(72) Inventors: Joachim Bamberger, Stockdorf (DE); Amer Mesanovic, Munich (DE); Andrei Szabo, Ottobrunn (DE)

(73) Assignee: SIEMENS AKTIENGESELLSCHAFT

( * ) Notice: Subject to any disclaimer, the term of this patent is extended or adjusted under 35 U.S.C. 154(b) by 44 days.

(21) Appl. No.: 17/205,356

(22) Filed: Mar. 18, 2021

(65) Prior Publication Data

US 2021/0302502 A1 Sep. 30, 2021

(30) Foreign Application Priority Data

Mar. 24, 2020 (EP) .................................... 20165139

(51) Int. Cl.
*G01R 31/36* (2020.01)
*G01R 31/367* (2019.01)
(Continued)

(52) U.S. Cl.
CPC ......... *G01R 31/367* (2019.01); *G01R 31/389* (2019.01); *G01R 31/3842* (2019.01); *G01R 31/392* (2019.01)

(58) Field of Classification Search
CPC .............. G01R 31/367; G01R 31/3842; G01R 31/389; G01R 31/392
See application file for complete search history.

(56) References Cited

U.S. PATENT DOCUMENTS

2013/0138369 A1* 5/2013 Papana .................. G01R 31/36
702/63
2016/0003912 A1* 1/2016 Iwane ................ G01R 31/3648
(Continued)

OTHER PUBLICATIONS

J. Meng, G. Luo, M. Ricco, M. Swierczynski, D.-I. Stroe, and R. Teodorescu, "Overview of lithium-ion battery modeling methods for state-of-charge estimation in electrical vehicles" Applied Sciences, vol. 8, No. 5, p. 659, 2018.; 2018.

*Primary Examiner* — Tarun Sinha
*Assistant Examiner* — Lal C Mang
(74) *Attorney, Agent, or Firm* — Schmeiser, Olsen & Watts LLP (57) ABSTRACT

In order to estimate states of health of batteries storing electrical energy significantly indicated by battery capacity and battery internal resistance, by which the estimation of states of health of batteries, deteriorated over time usage, is automated and carried out without a need of any specific test such as a capacity test and the usage of data out of normal operation, it is proposed to collect data from normal operation of a battery storing electrical energy relating to battery-internal physical properties such as a terminal direct current $I_{DC}$, a terminal direct voltage $U_{DV}$ and a battery cell temperature T due to battery measurements and the determination or estimation, based on this data and a battery model, of a model parameter by solving an optimization-/model parameter estimation-problem and minimizing a difference between the battery model and the battery measurements.

12 Claims, 5 Drawing Sheets

(51) Int. Cl.
  *G01R 31/389* (2019.01)
  *G01R 31/392* (2019.01)
  *G01R 31/3842* (2019.01)

(56) References Cited

U.S. PATENT DOCUMENTS

2016/0248126 A1 8/2016 Wang
2018/0059190 A1* 3/2018 Verbrugge ......... G01R 31/3658
2019/0207406 A1 7/2019 Matthey et al.

* cited by examiner

METHOD, COMPUTER-IMPLEMENTED TOOL AND BATTERY MANAGEMENT SYSTEM FOR ESTIMATING STATES OF HEALTH OF BATTERIES STORING ELECTRICAL ENERGY AND BATTERY ENERGY STORAGE SYSTEM

CROSS-REFERENCE TO RELATED APPLICATIONS

This application claims priority to EP Application No.20165139.5, having a filing date of Mar. 24, 2020, the entire contents of which are hereby incorporated by reference.

FIELD OF TECHNOLOGY

The following relates to a method for estimating states of health of batteries storing electrical energy.

BACKGROUND

Batteries used in battery energy storage systems, called BESS, for storing electrical energy include battery cells, which nowadays are mainly based on lithium-ion storage technology.

It is well known that the battery storing electrical energy respectively the BESS deteriorates over time due to usage and even if it is only stored without being used. The main indicators of this deterioration are the loss of storage capacity and the increase in internal resistance of the battery respectively the BESS. Typically, the determination of aging or state-of-health (SOH) of the battery or BESS is determined by performing capacity tests, where a charging and discharging procedure is followed.

For this, the battery or BESS is taken out of normal operation and it is specially tested.

Typically, with the state-of-health it is meant the current battery capacity expressed in Ampere hours (Ah) compared with the nominal capacity.

The most common way for determining the state-of-health is to perform standard capacity tests which imply charging full the battery and then discharging it completely. During this test the current that flows is measured, and the capacity is then determined as the integral of the current, expressed in Ah. The test can be performed at the beginning of the battery life, e.g. a factory acceptance test, and during operation.

The disadvantage of this approach is that the battery needs to be taken out of the normal operation to perform the test resulting in system unavailability. Further on, the test is performed manually which implies costs. Also, such a test is stressful for the battery; the estimation of the capacity during the normal operation is avoiding this stress.

Modern Battery Management Systems (BMS) of a BESS offer also an estimation of the current capacity and the SOH during the normal operation. This is typically done by having stored parameters of the BESS obtained during design, engineering and testing of the BESS using a cell type. These parameters are used then in the normal operation to estimate a State-of-Charge (SOC) and of the SOH considering the usage of the BESS, e.g. a time passed since production of the cell, an energy throughput, etc.

The BMS can have sophisticated parameters sets for different aging states of the BESS to improve accuracy.

The disadvantage of this approach is that the parameters are stored beforehand in the BMS and are not adapted from the current BESS operation and measurements. They are also general for a BESS/cell type, not accounting for deviations between several BESS/cell of the same type.

SUMMARY

An aspect relates to propose a method, computer-implemented tool and battery management system for estimating states of health of batteries storing electrical energy as well as a battery energy storage system, by which the estimation of states of health of batteries, deteriorated over time usage, is automated and carried out without a need of any specific test such as a capacity test and the usage of data out of normal operation.

The main idea of embodiments of the invention to estimate states-of-health of batteries significantly indicated by battery capacity and battery internal resistance are:

the collection of data from normal operation of a battery storing electrical energy relating to battery-internal physical properties such as a terminal direct current $I_{DC}$, a terminal direct voltage $U_{DV}$ and a battery cell temperature T due to battery measurements and the determination or estimation, based on this data and a battery model, of a model parameter by solving an optimization-/model parameter estimation-problem and minimizing a difference between the battery model and the battery measurements.

The estimation/determination of the model parameter is executed based or performed on batches of data during a time period in which the battery aging is negligible, e.g., duration of one day up to one week. By repeating the estimation over the lifetime, e.g., over numerous time periods with constant or variable time durations, a state-of-heath degradation can be monitored.

The used battery model relates different battery parameters, technical features to battery internal states and the different measurable physical properties.

In literature there are many such models defined, for an overview see [1].

Figure 4:
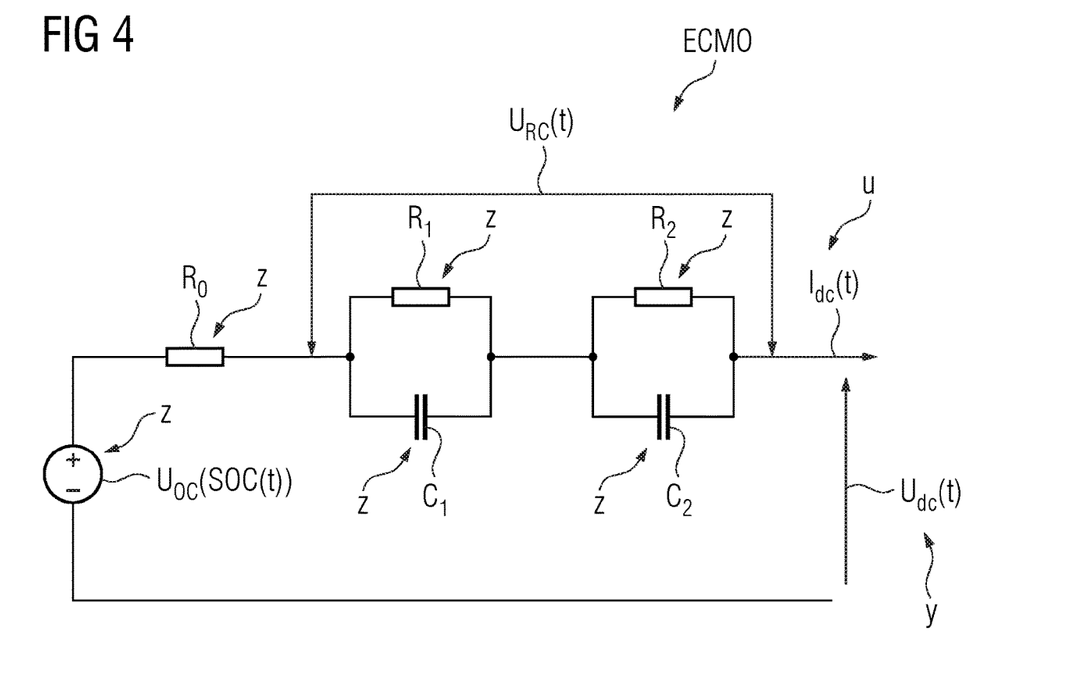
FIG. 4 shows an Equivalent Circuit Model of a battery.

According to an advantageous development of embodiments of the invention an Equivalent Circuit Model (ECM) is used as the battery model. An example of an ECM-model is depicted in FIG. 4. However, alternatively also other models with different degrees of detail and equation types can be used.

Additionally, according to a further advantageous development of embodiments of the invention in the context of solving the optimization-/model parameter estimation-problem of the Equivalent Circuit Model with regard to the model parameter a parameter ambiguity due to a dependency of the model parameter z on the open circuit voltage $U_{OC}$ and the battery-internal capacity C for determining a "a time t"-dependent state-of-charge SOC(t) is eliminated by calibrating the open circuit voltage $U_{OC}$ and the state-of-charge SOC(t) as a result of considering a defined value of the capacity C, in particular a known value of the capacity C, into the solution of the optimization-/model parameter estimation-problem.

Moreover, according to a further advantageous development of embodiments of the invention a notification information for notifying about an increase of the battery-state-of-health more than expected or in case of battery operating safety risks is generated as result of evaluating or doing the state of health trend analysis of the model parameter respectively the battery-internal resistance R and/or the battery-internal capacity C The notification information is generated in following cases:

The capacity C decreases below a guaranteed threshold, possible dependent on the time or battery usage.

The internal resistance R increases above a threshold. This leads to a risk of fire.

Embodiments of the invention outlined above have the following benefits:

It is not necessary to interrupt the normal operation of the battery respectively the BESS for monitoring a state-of-health.

The approach according to embodiments of the invention is more robust then known approaches relying only on factory tests and models.

Due to the approach according to embodiments of the invention it is possible to detect sudden changes in the internal resistance R which represent a high risk for the safety of the battery respectively the BESS.

Embodiments of the invention outlined above have advantages/benefits in view of the following applications:

Application to preventive maintenance:

A replacement of cells/modules of the battery respectively the BESS can be prepared, when estimation shows that they are going to break in the next month.

The benefit is: The replacement duration can be significantly shortened, which without preparation can be long, e.g. in the order of months. By this also loss of production can be reduced.

To have cells of the battery or the BESS prepared for the operation start is not economic due to calendric aging of the cells.

Application to component guarantee and warranty issues:
When cells show an aging faster than the OEM guarantee, a guarantee claim can be made before the system breakdown, and by this an outage time is avoided, which is prolonged by the negotiation with the OEM.

Application to operation optimization:

Improve the control of the battery or BESS, which relies on the Battery Management System (BMS) to reduce safety margins and by this improve revenue.

BRIEF DESCRIPTION

Some of the embodiments will be described in detail, with reference to the following figures, wherein like designations denote like members, wherein.

DETAILED DESCRIPTION

Figure 1:
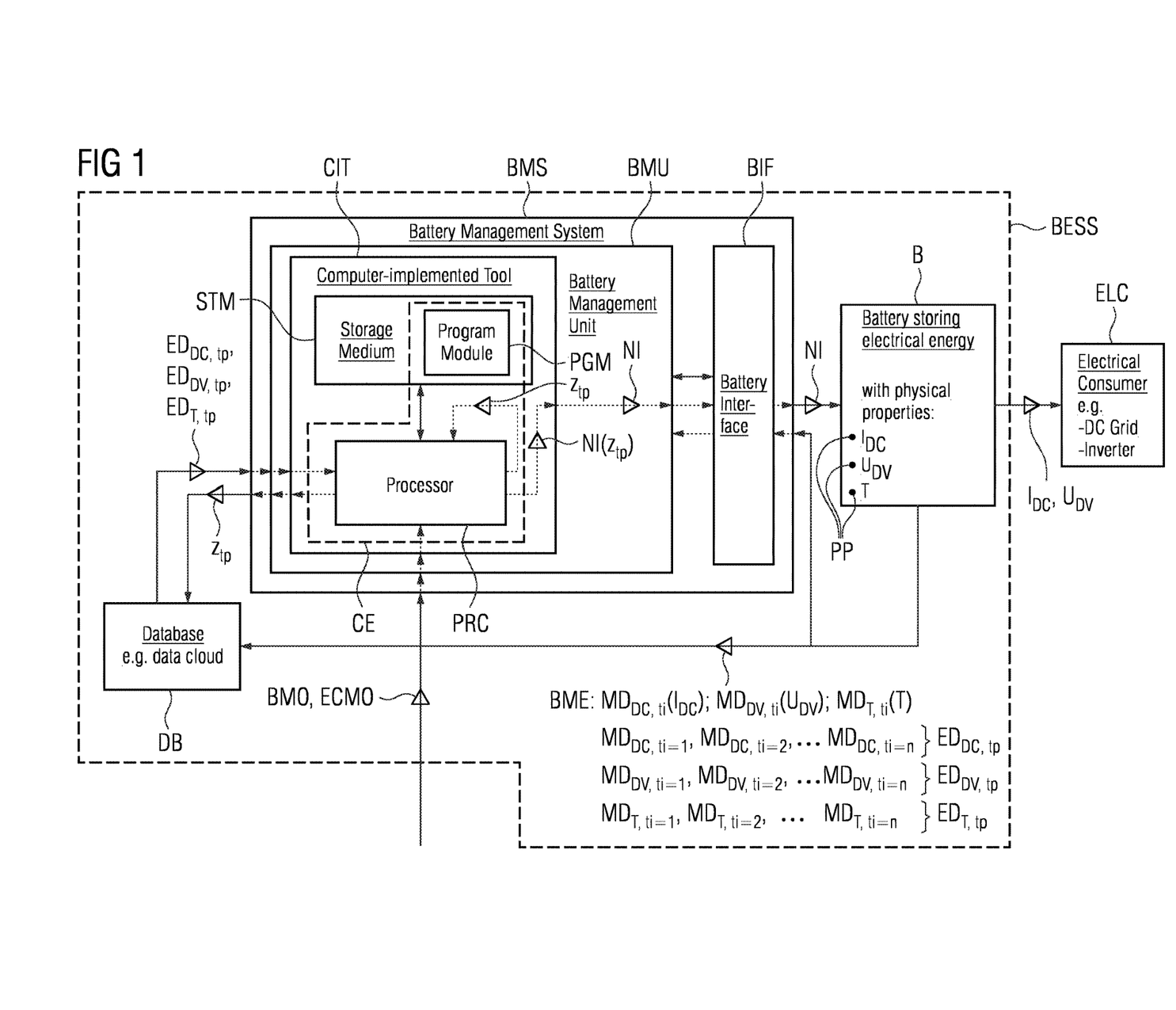
FIG. 1 shows a battery energy storage system for estimating states-of-health (SOH) of batteries storing electrical energy as an "implementation-concept"

FIG. 1 shows a battery energy storage system BESS for estimating a state-of-health (SOH) of a battery B storing electrical energy as an "implementation-concept".

According to this depiction the battery energy storage system BESS includes, besides the battery B with physical properties PP such as inter alia a terminal direct current $I_{DC}$ as a first physical property, a terminal direct voltage $U_{DV}$ as a second physical property and a battery cell temperature T as a third physical property, in the context of storing electrical energy as a central component for controlling and managing purposes with regard to the storage, provision and delivery of electrical energy stored in the battery B a battery management system BMS and moreover a database DB, which is designed as a data cloud. One of the usual goals of the battery management system BMS is to enable an electrical consumer ELC, which is connected to the battery B and which is designed for instance as a DC-grid or an inverter, to get the requested electrical energy given by providing the terminal direct current $I_{DC}$ and the terminal direct voltage $U_{DV}$ over a period of time out of the battery B. For this goal and the cited purposes, the battery management system BMS includes a battery management unit BMU and a battery interface BIF, wherein the corresponding control of the battery B is carried out by the battery management unit BMU via the battery interface BIF.

Furthermore in the context of the estimating task of the battery energy storage system BESS the battery management system BMS with the cited two components, the battery management unit BMU and the battery interface BIF, is also responsible for estimating the state-of-health of the battery B. Therefor according to the "implementation-concept" depicted in the FIG. 1 the battery management unit BMU includes a computer-implemented tool CIT which is implemented as a sub-unit in the battery management unit BMU. The computer-implemented tool CIT is a computer program product (non-transitory computer readable storage medium having instructions, which when executed by a processor, perform actions) which is designed as an application software, called as APP, that allows, when it is implemented, to perform special tasks. So, in the present case of the battery management unit BMU, where the computer-program-product respectively the APP is implemented, the computer-implemented tool CIT is used for estimating the state-of-health of the battery B.

To this end the computer-implemented tool CIT comprises a non-transitory, processor-readable storage medium STM, in which processor-readable program-instructions of a program module PGM are stored. This program module PGM is used for estimating the state-of-health of the battery B. Moreover, the computer-implemented tool CIT comprises a processor PRC connected with the storage medium STM executing the processor-readable program-instructions of the program module PGM to estimate the state-of-health, wherein the program module PGM and the processor PRC form a calculation engine CE for doing this estimation.

The estimation is generally based on battery measurements BME, which however are carried out independently from the estimation process itself. So, from the battery B storing electrical energy measurement data are collected and stored. This data collection and storage arise from the battery measurements BME of the battery-internal physical properties PP inter alia the measurement of the terminal direct current Inc as the first physical property, the terminal direct voltage UDV as the second physical property and the battery cell temperature T as third physical property. The battery measurements BME occur during a recurring time interval ti, which is at the most over a lifetime of the battery B. The measurements are done advantageously in a continuous manner, e.g. n times, and the cited measurement data for the time interval ti include each direct current measurement data $MD_{DC,ti}$ related to the terminal direct current $I_{DC}$, direct voltage measurement data $MD_{DV,ti}$ related to the terminal direct voltage $U_{DV}$ and temperature measurement data $MD_{T,ti}$ related to the battery cell temperature T. The storage of the data $MD_{DC,ti}$, $MD_{DV,ti}$, $MD_{T,ti}$, collected per each time interval ti, takes place in the database DB.

This means that in the database DB for the n time intervals ti, namely time intervals ti=1, ti=2, . . . ti=n, direct current measurement data $MD_{DC,ti=1}$, $MD_{DC,ti=2}$, . . . $MD_{DC,ti=n}$ of the direct current measurement data $MD_{DC,ti}(I_{DC})$, direct voltage measurement data $MD_{DV,ti=1}$, $MD_{DV,ti=2}$, . . . $MD_{DV,ti=n}$ of the direct voltage measurement data $MD_{DV,ti}(U_{DV})$ and temperature measurement data $MD_{T,ti=1}$, $MD_{T,ti=2}$, . . . $MD_{T,ti=n}$ of the temperature measurement data $MD_{T,ti}(T)$ are stored.

For doing now the cited estimation of the battery-state-of-health the calculation engine CE formed by the processor PRC and the program module PGM (1) selects a time period tp with tp≥n·ti and n∈ℕ, (2) executes a dynamical battery model BMO for the time period tp, which is assigned to the processor and according to FIG. 4 designed as an equivalent circuit model ECMO, which relates to measurable model input sizes u, measurable model output sizes y, model states x and model parameter z and which is a time t discretized such that a model state $x_{t+1}$ is defined to a first function f with $x_{t+1}:=f_{tp}(x_t,u_t,z)$ and a model output size $y_t$ is defined to a second function g with $y_t:=g_{tp}(x_t,u_t,z)$, by accessing to, inputting into the calculation engine CE, direct current evaluation data $ED_{DC,tp}$ for the time period tp including the direct current measurement data $MD_{DC,ti=1}$, $MD_{DV,ti=2}$, . . . $MD_{DV,ti=n}$ relating to the measurable model input sizes u and stored for the n time intervals ti in the database DB, direct voltage evaluation data $ED_{DV,tp}$ for the time period tp including the direct voltage measurement data $MD_{DV,ti=1}$, $MD_{DV,ti=2}$, . . . $MD_{DV,ti=n}$ relating to the measurable model output sizes y and stored for the n time intervals ti in the database DB, temperature evaluation data $ED_{T,tp}$ for the time period tp including temperature measurement data $MD_{T,ti=1}$, $MD_{T,ti=2}$, . . . $MD_{T,ti=n}$ relating to the measurable model input sizes u and stored for the n time intervals ti in the database DB, solving an optimization-/model parameter estimation-problem given by the first function f, the second function g, the model input sizes u and the model output sizes y such that the solution of the problem yields a model parameter $z_{tp}$ for the time period tp, which minimizes a difference between the battery model BMO and the battery measurements BME and enables the indication of the battery-state-of-health due to being constant for the selected time period tp, (3) evaluates or does a state-of-health trend analysis of an evolutionary course of the model parameter $z_{tp}$ being determined by solving the optimization-/model parameter estimation-problem over numerous time periods tp with constant or variable time durations.

Moreover, for extending the cited estimation of the battery-state-of-health advantageously the calculation engine CE is designed such that a notification information NI for notifying about an increase of the battery-state-of-health more than expected or in case of battery operating safety risks is generated as result of evaluating or doing the state-of-health trend analysis of the model parameter $z_{tp}$.

FIG. 4 shows the equivalent circuit model ECMO of the battery B already mentioned above, which is used as the battery model BMO. This means for the explanations outlined above regarding the battery model BMO that with reference to the equivalent circuit model ECMO the model input sizes u depend on a "the time t"-dependent terminal direct current $I_{DC}(t)$ and the battery cell temperature T with $u=[I_{DC}(t), T, \ldots ]$, the model output sizes y depend on a "the time t"-dependent terminal direct voltage $U_{DV}(t)$ with $y=[U_{DV}(t), \ldots ]$, the model states x depend on a "the time t"-dependent state-of-charge (SOC) with $x=[SOC(t), \ldots ]$ and the model parameter z depend on an open circuit voltage Uoc being dependent on a "the time t"-dependent state-of-charge SOC(t), depending on a battery-internal resistance R and depending on a battery-internal capacity C with $z=[U_{OC}(SOC(t)), C, R, \ldots ]$ and $C=C1+C2$; $R=R_0+R_1+R_2$.

The parameter z are changing with the usage of the battery B, but this change is slow over the time. It can be assumed that during a period of time, for example several days, these are constant.

Moreover, to solve the optimization-/model parameter estimation-problem with regard to the model parameter $z_{tp}$ and the time period tp as outlined above the following formulas (I) and (II) with reference to the equivalent circuit model ECMO have to been solved $$\text{Error}(z) = \text{mean}[(Y_{tp,BMO}(g_{tp},U_{tp,BME})-Y_{tp,BME})^2] \text{ and} \quad (I)$$

$$z_{tp} = \text{argmin}_z[\text{Error}(z)] \text{ with} \quad (II)$$

$$Y_{tp,BME}[ED_{DV,tp}] := \{y_{1,BME}[MD_{DV,ti=1}:=U_{DV,ti=1}(t)], y_{2,BME}[MD_{DV,ti=2}:=U_{DV,ti=2}(t)], \ldots y_{n,BME}[MD_{DV,ti=n}:=U_{DV,ti=n}(t)]\}$$

$$U_{tp,BME}[ED_{DC,tp},ED_{T,tp}] := \{u_{1,BME}[MD_{DC,ti=1}:=I_{DC,ti=1}(t),MD_{T,ti=1}:=T_{ti=1}],u_{2,BME}[MD_{DC,ti=2}:=I_{DC,ti=2}(t),MD_{T,ti=2}:=T_{ti=2}], \ldots u_{n,BME}[MD_{DC,ti=n}:=I_{DC,ti=n}(t),MD_{T,ti=n}:=T_{ti=n}]\}$$

$$Y_{tp,BMO}(g_{tp},U_{tp,BME}[ED_{DC,tp},ED_{T,tp}]) := \{y_{1,BMO}:=g_{ti=1}(x_0,u_{1,BME}[MD_{DC,ti=1}:=I_{DC,ti=1}(t),MD_{T,ti=1}:=T_{ti=1}],z),y_{2,BMO}:=g_{ti=2}(x_1,u_{2,BME}[MD_{DC,ti=2}:=I_{DC,ti=2}(t),MD_{T,ti=2}:=T_{ti=2}],z), \ldots y_{n,BMO}:=g_{ti=1}(x_{n-1},u_{n,BME}[MD_{DC,ti=n}:=I_{DC,ti=n}(t),MD_{T,ti=n}:=T_{ti=n}],z)\}.$$

This means with respect to the notification information NI for notifying about an increase of the battery-state-of-health more than expected or in case of battery operating safety risks and generated as result of evaluating or doing the state-of-health trend analysis of the model parameter $z_{tp}$ that the notification information NI is generated as result of evaluating or doing the state-of-health trend analysis of the battery-internal resistance R and/or the battery-internal capacity C.

The result of the estimation is the model parameter $z_{tp}$ including the capacity C and the total internal resistance R. These two are the model sizes of the battery B indicating the state-of-health of the battery B.

Figure 2:
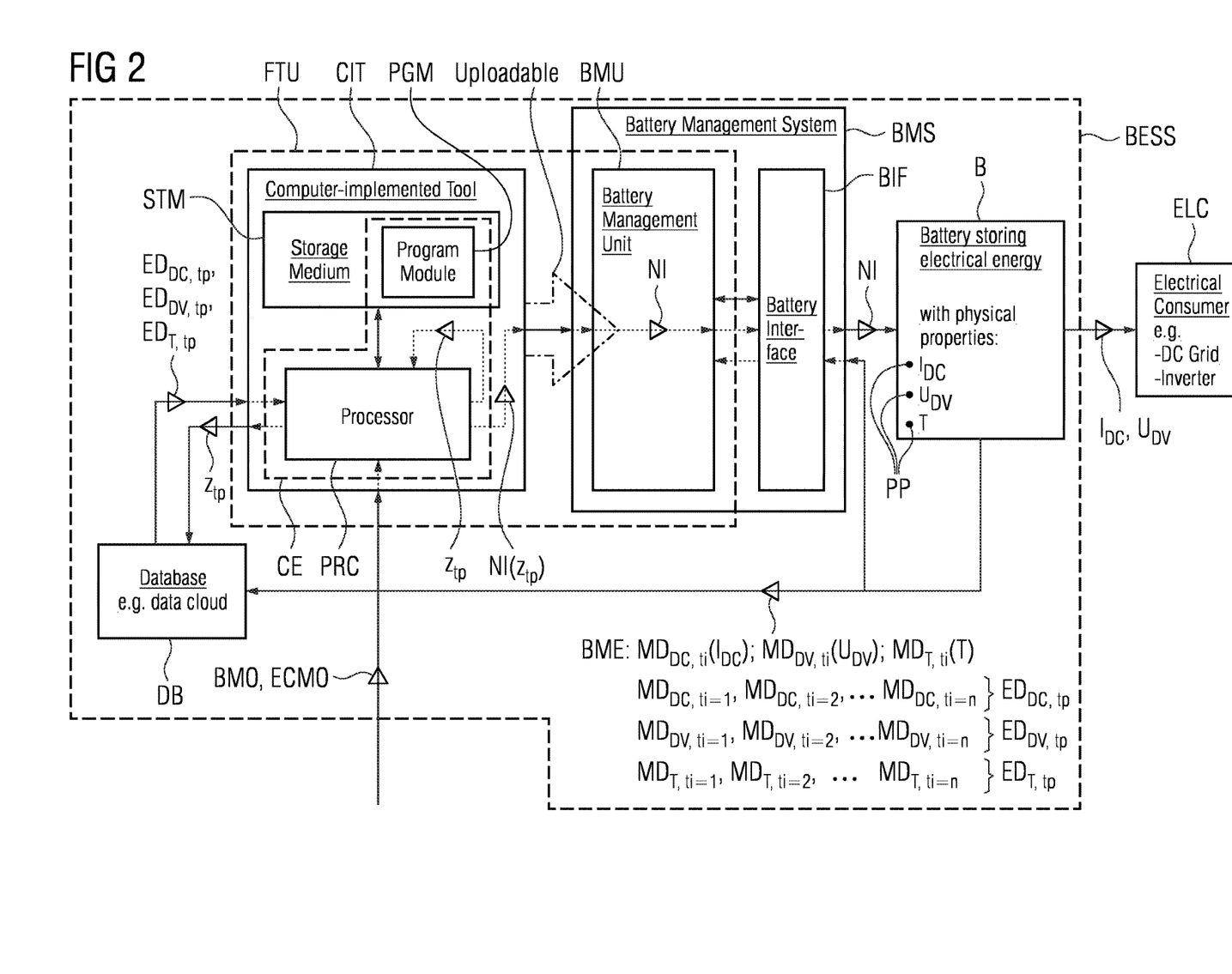
FIG. 2 shows a battery energy storage system for estimating states-of-health (SOH) of batteries storing electrical energy as a "functional-unit-concept"

FIG. 2 shows the battery energy storage system BESS for estimating the states-of-health (SOH) of the battery B storing electrical energy as a "functional-unit-concept". Also according to this depiction the battery energy storage system BESS includes, besides the battery B with the physical properties PP such as inter alia the terminal direct current $I_{DC}$ as the first physical property, the terminal direct voltage $U_{DV}$ as the second physical property and the battery cell temperature T as the third physical property, in the context of storing electrical energy again as the central component for controlling and managing purposes with regard to the storage, provision and delivery of electrical energy stored in the battery B the battery management system BMS and moreover the database DB, which is designed as a data cloud. Again, one of the usual goals of the battery management system BMS is to enable the electrical consumer ELC, which is connected to the battery B and which is designed for instance as the DC-grid or the inverter, to get the requested electrical energy given by providing the terminal direct current $I_{DC}$ and the terminal direct voltage $U_{DV}$ over a period of time out of the battery B. For this goal and the cited purposes the battery management system BMS includes again the battery management unit BMU and the battery interface BIF, wherein the corresponding control of the battery B is carried out by the battery management unit BMU via the battery interface BIF.

In the context of the estimating task of the battery energy storage system BESS the battery management system BMS with the cited two components, the battery management unit BMU and the battery interface BIF, is now—in contrast to the battery management system BMS depicted in the FIG. 1—not directly responsible for estimating the state-of-health of the battery B. Therefor according to the "functional-unit-concept" depicted in the FIG. 2 the battery management unit BMU does not include the computer-implemented tool CIT. Instead, the Computer-implemented tool CIT forms a functional unit FTU with the battery management unit BMU. This functional unit FTU is designed such that the Computer-implemented tool CIT is either uploadable into the battery management unit BMU according to the depiction in the FIG. 2 or forms either (not depicted in the FIG. 2) a cloud-based, centralized platform, e.g. a server, for the battery management system BMS or a decentralized platform, e.g. a server, for the battery management system BMS with a mutual access within the functional unit between the battery management unit BMU and the Computer-implemented tool CIT.

In each of cited variants of realization the computer-implemented tool CIT is again a computer-program-product which in the case upload-functionality is again designed as an application software, called as APP, that allows, when it is implemented, to perform special tasks. So, in the present case of the battery management unit BMU, when the computer-program-product respectively the APP is uploaded, the battery management system BMS with uploaded computer-implemented tool CIT is used for estimating the state-of-health of the battery B.

To this end the computer-implemented tool CIT comprises again the non-transitory, processor-readable storage medium STM, in which processor-readable program-instructions of the program module PGM are stored. This program module PGM is used for estimating the state-of-health of the battery B. Moreover, the computer-implemented tool CIT comprises again also the processor PRC connected with the storage medium STM executing the processor-readable program-instructions of the program module PGM to estimate the state-of-health, wherein the program module PGM and the processor PRC form again the calculation engine CE for doing this estimation.

Here too, the estimation is generally based on battery measurements BME, which however are carried out, independent, from the estimation process itself. So, from the battery B storing electrical energy measurement data are collected and stored. This data collection and storage arise from the battery measurements BME of the battery-internal physical properties PP inter alia the measurement of the terminal direct current Inc as the first physical property, the terminal direct voltage UDV as the second physical property and the battery cell temperature T as third physical property.

The battery measurements BME occur during a recurring time interval ti. The measurements again are done advantageously in a continuous manner, e.g., n times, which are done at the most once a lifetime of the battery B.

The cited measurement data for the time interval ti include each the direct current measurement data $MD_{DC,ti}$ related to the terminal direct current $I_{DC}$, the direct voltage measurement data $MD_{DV,ti}$ related to the terminal direct voltage $U_{DV}$ and the temperature measurement data $MD_{T,ti}$ related to the battery cell temperature T. As desired again the storage of the data $MD_{DC,ti}$, $MD_{DV,ti}$, $MD_{T,ti}$ collected per each time interval ti, takes place in the database DB.

This means again that in the database DB for the n time intervals ti, namely the time intervals ti=1, ti=2, ... ti=n, the direct current measurement data $MD_{DC,ti=1}$, $MD_{DC,ti=2}$, ... $MD_{DC,ti=n}$ of the direct current measurement data $MD_{DC,ti}(I_{DC})$, the direct voltage measurement data $MD_{DV,ti=1}$, $MD_{DV,ti=2}$, ... $MD_{DV,ti=n}$ of the direct voltage measurement data $MD_{DV,ti}(U_{DV})$ and the temperature measurement data $MD_{T,ti=1}$, $MD_{T,ti=2}$, ... $MD_{T,ti=n}$ of the temperature measurement data $MD_{T,ti}(T)$ are stored.

Again, now for doing the cited estimation of the battery-state-of-health the calculation engine CE formed by the processor PRC and the program module PGM (1) selects the time period tp with tp≥n·ti and n∈ℕ, (2) executes the dynamical battery model BMO for the time period tp, which again is assigned to the processor and according to the FIG. 4 designed as an equivalent circuit model ECMO, which relates to the measurable model input sizes u, the measurable model output sizes y, the model states x and the model parameter z and which is the time t discretized such that the model state $x_{t+1}$ is defined to the first function f with $x_{t+1}:=f_{tp}(x_t,u_t,z)$ and the model output size $y_t$ is defined to the second function g with $y_t:=g_{tp}(x_t,u_t,z)$, by accessing to, inputting into the calculation engine CE, the direct current evaluation data $ED_{DC,tp}$ for the time period tp including the direct current measurement data $MD_{DC,ti=1}$, $MD_{DC,ti=2}$, ... $MD_{DC,ti=n}$ relating to the measurable model input sizes u and stored for the n time intervals ti in the database DB, the direct voltage evaluation data $ED_{DV,tp}$ for the time period tp including the direct voltage measurement data $MD_{DV,ti=1}$, $MD_{DV,ti=2}$, ... $MD_{DV,ti=n}$ relating to the measurable model output sizes y and stored for the n time intervals ti in the database DB, the temperature evaluation data $ED_{T,tp}$ for the time period tp including the temperature measurement data $MD_{T,ti=1}$, $MD_{T,ti=2}$, ... $MD_{T,ti=n}$ relating to the measurable model input sizes u and stored for the n time intervals ti in the database DB, solving the optimization-/model parameter estimation-problem given by the first function f, the second function g, the model input sizes u and the model output sizes y such that the solution of the problem yields a model parameter $z_{tp}$ for the time period tp, which minimizes the difference between the battery model BMO and the battery measurements BME and enables the indication of the battery-state-of-health due to being constant for the selected time period tp, (3) evaluates or does the state-of-health trend analysis of the evolutionary course of the model parameter $z_{tp}$ being determined by solving the optimization-/model parameter estimation-problem over numerous time periods tp with constant or variable time durations.

Furthermore, for extending the cited estimation of the battery-state-of-health advantageously here too, the calculation engine CE is designed such that the notification information NI for notifying about an increase of the battery-state-of-health more than expected or in case of battery operating safety risks is generated as result of evaluating or doing the state-of-health trend analysis of the model parameter $z_{tp}$.

Figure 3:
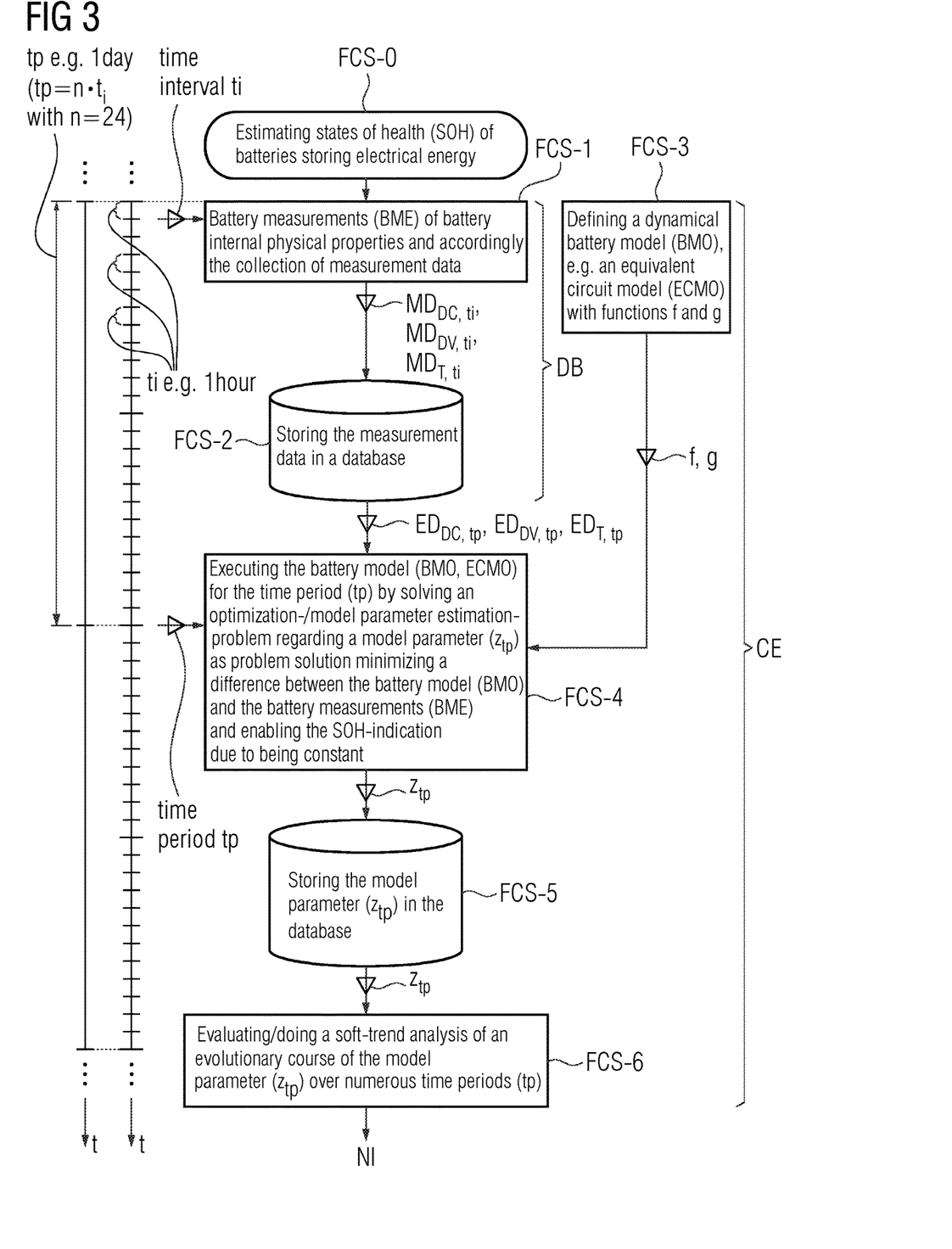
FIG. 3 shows a flow chart of a first process estimating states-of-health (SOH) of batteries storing electrical energy.

FIG. 3 shows a flow chart of a first process estimating states-of-health (SOH) of batteries storing electrical energy being initiated in a flow-chart-state FCS-0 and summarizing the entire estimation process according to the description of the FIGS. 1, 2 and 4.

The first process starts with that in a first flow-chart-state FCS-1 and for the time interval ti, which could be for instance 1 hour or any other period of time such as 10 or 15 minutes (i.e. the 1 hour time interval was chosen only for reasons of illustration in relation to the depicted time period tp, e.g. 1 day) the battery measurements BME of battery-internal physical properties PP and accordingly the collection of the measurement data $MD_{DC,ti}$, $MD_{DV,ti}$, $MD_{T,ti}$ are carried out.

In a following second flow-chart-state FCS-2 the collected measurement data $MD_{DC,ti}$, $MD_{DV,ti}$, $MD_{T,ti}$ are stored in the database DB.

The actions of both flow-chart-state FCS-1, FSC-2 are related to the involvement of the database DB as indicated in the FIG. 3.

In a third flow-chart-state FCS-3 the dynamical battery model BMO respectively and the equivalent circuit model ECMO with the functions f and g is defined. This is done independently from the actions take place in the first and second flow-chart-state FCS-1, FCS-2.

This definition of the model BMO, ECMO is used such that in a fourth flow-chart-state FCS-4
for the time period tp, which could be for instance 1 day or any other period of time such as 2 or 5 days up to a week (i.e., the 1 day time period was chosen only for reasons of illustration in relation to the depicted time interval ti, e.g. 1 hour), and
based on the two functions f and g as well the direct current evaluation data $ED_{DC,tp}$ including the direct current measurement data $MD_{DC,ti=1}$, $MD_{DC,ti=2}$, ... $MD_{DC,ti=n}$, the direct voltage evaluation data $ED_{DV,tp}$ including the direct voltage measurement data $MD_{DV,ti=1}$, $MD_{DV,ti=2}$, ... $MD_{DV,ti=n}$, the temperature evaluation data $ED_{T,tp}$ including the temperature measurement data $MD_{T,ti=1}$, $MD_{T,ti=2}$, ... $MD_{T,ti=n}$ stored for the n time intervals ti in the database DB,
the battery model BMO, ECMO is executed by solving the optimization-/model parameter estimation-problem regarding the model parameter $z_{tp}$ as problem solution minimizing the difference between the battery model BMO and the battery measurements BME and enabling the SOH-indication due to being constant.

In a subsequent fifth flow-chart-state FCS-5 the generated model parameter $z_{tp}$ is stored in the database DB.

Finally, in a subsequent sixth flow-chart-state FCS-6 a state-of-health trend analysis of an evolutionary course of the model parameter $z_{tp}$ being determined by solving the optimization-/model parameter estimation-problem over numerous time periods tp is evaluated or done. The numerous time periods tp can have time durations being constant or variable.

As result of evaluating or doing the SOH-trend analysis of the model parameter $z_{tp}$ the notification information NI for notifying about an increase of the battery-state-of-health more than expected or in case of battery operating safety risks is generated.

The actions from the third flow-chart-state FCS-3 to the sixth flow-chart-state FCS-6 are related to the involvement of the calculation engine CE as indicated in the FIG. 3.

Figure 5:
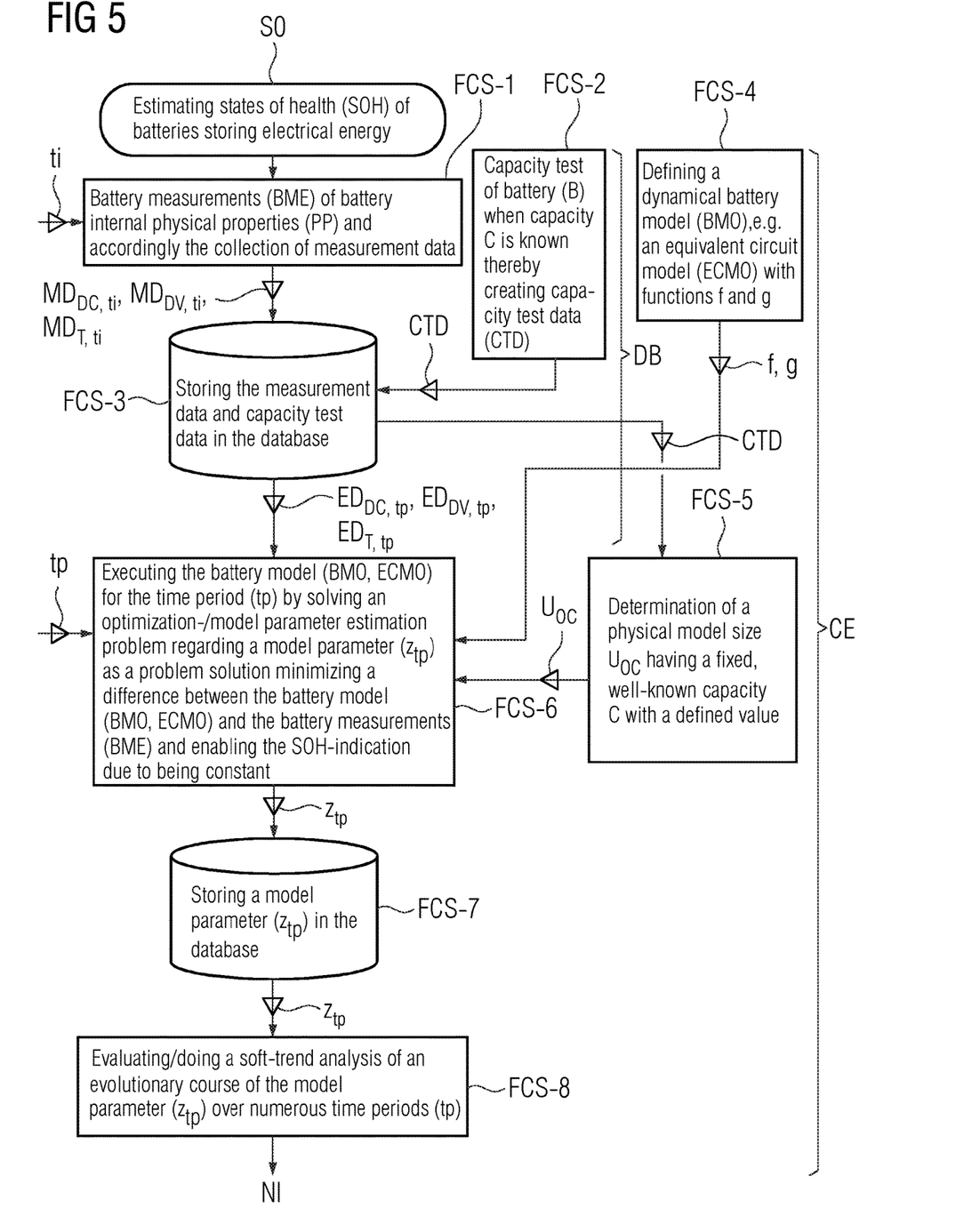
FIG. 5 shows a flow chart of a second process estimating states-of-health (SOH) of batteries storing electrical energy.

FIG. 5 shows a second flow chart of a process estimating states-of-health (SOH) of batteries storing electrical energy being initiated again in a flow-chart-state FCS-0 and summarizing the entire estimation process according to the description of the FIGS. 1, 2 and 4.

The second flow chart of the SOH estimating process in comparison to the first flow chart of the SOH estimating process according to the FIG. 3 is a refinement of the process in the case that the model parameter $z_{tp}$ identification by solving the optimization-/model parameter estimation-problem is ambiguous with respect some physical model sizes relevant to the determination of the state-of-health (SOH).

With reference to the equivalent circuit model ECMO taken as the battery model BMO such a case is typically the capacity C and the open circuit voltage $U_{OC}$ dependency on state-of-charge (SOC). Such an ambiguity can be solved using the fact that such model sizes although not well known at the battery production, they are constant with the battery or BESS aging or they are changing very slow, slower than the reduction of the capacity C.

Consequently, these model sizes can be calibrated when the capacity C is known and then considered fixed in the model parameter $z_{tp}$ identification by solving the optimization-/model parameter estimation-problem.

Such cases when the capacity C is known are factory and plant acceptance tests, when the capacity C is determined by dedicated tests. Using capacity test data CDT from these tests or from the normal operation around these tests then the open circuit voltage $U_{OC}$ can be determined. For the rest of the lifetime or until the next test the open circuit voltage $U_{OC}$ is assumed known and the capacity C is determined.

The process refinement comprises two additional flow-chart-states (cf. FCS-2 and FCS-5 in the FIG. 5) in comparison to the FIG. 3 concerning the following two stages:
Estimation or determination of invariable model sizes, e.g., the open circuit voltage dependency on the state-of-charge (SOC), at the beginning of battery production/at points when the capacity C and/or the state-of-charge (SOC) are known, e.g. factory test, guarantee test.
Estimation or determination of long-term variable model sizes, e.g., capacity C, resistance R during the lifetime of the battery or BESS, based on the operation measurements.

The second process starts also with that in a first flow-chart-state FCS-1 and for the time interval ti, which could be for instance 1 hour or any other period of time such as 10 or 15 minutes (i.e. the 1 hour time interval was chosen only for reasons of illustration in relation to the depicted time period tp, e.g. 1 day) the battery measurements BME of battery-internal physical properties PP and accordingly the collection of the measurement data $MD_{DC,ti}$, $MD_{DV,ti}$, $MD_{T,ti}$ are carried out.

Independent from this flow-chart-state in a second flow-chart-state FCS-2 a capacity test of the battery B is carried out, when the capacity is known for instance during the manufacturing process of the battery in a factory, and thereby creating accordingly capacity test data CTD.

In a following third flow-chart-state FCS-3 the collected measurement data $MD_{DC,ti}$ $MD_{DV,ti}$, $MD_{T,ti}$ and the created capacity test data CTD are stored in the database DB.

The actions of then three flow-chart-state FCS-1, FSC-2, FCS-3 are related to the involvement of the database DB as indicated in the FIG. 5.

In a further fourth flow-chart-state FCS-4 again the dynamical battery model BMO respectively and the equivalent circuit model ECMO with the functions f and g is defined. This is done also independently from the actions take place in the three flow-chart-states FCS-1, FCS-2, FCS-3.

Moreover, in an additional fifth flow-chart-state FCS-5 a determination of the physical model size $U_{OC}$ having a fixed, well-known capacity C with a defined value is done based on the created capacity test data CTD stored in the database DB.

In a subsequent sixth flow-chart-state FCS-6 the battery model BMO, ECMO with the function f and g defined in the fourth flow-chart-state FCS-4 is again used such that for the time period tp, which could be for instance 1 day or any other period of time such as 2 or 5 days up to a week (i.e., the 1 day time period was chosen only for reasons of illustration in relation to the depicted time interval ti, e.g. 1 hour), and based on the two functions f and g as well the direct current evaluation data $ED_{DC,tp}$ including the direct current measurement data $MD_{DC,ti=1}$, $MD_{DC,ti=2}$, ... $MD_{DC,ti=n}$, the direct voltage evaluation data $ED_{DV,tp}$ including the direct voltage measurement data $M_{DV,ti=1}$, $MD_{DV,ti=2}$, ... $MD_{DV,ti=n}$, the temperature evaluation data $ED_{T,tp}$ including the temperature measurement data $MD_{T,ti=1}$, $MD_{T,ti=2}$, ... $MD_{T,ti=n}$ stored for the n time intervals ti in the database DB, the battery model BMO, ECMO is executed by solving the optimization-/model parameter estimation-problem regarding the model parameter $z_{tp}$ as problem solution minimizing the difference between the battery model BMO and the battery measurements BME and enabling the SOH-indication due to being constant.

Furthermore in addition to the first process depicted in the FIG. 3 the physical model size $U_{OC}$ determined in the fifth flow-chart-state FCS-5 is used such that in order to solve the optimization-/model parameter estimation-problem of the Equivalent Circuit Model ECMO with regard to the model parameter $z_{tp}$ a parameter ambiguity due to a dependency of the model parameter z on the open circuit voltage $U_{OC}$ and the battery-internal capacity C for determining the "a time t"-dependent state-of-charge SOC(t) is eliminated by calibrating the open circuit voltage $U_{OC}$ and the state-of-charge SOC(t) as a result of considering a defined value of the capacity C, namely—as outlined above—the known value of the capacity C, into the solution of the optimization-/model parameter estimation-problem.

In a subsequent seventh flow-chart-state FCS-7 again the generated model parameter $z_{tp}$ is stored in the database DB.

Finally, again in a subsequent eighth flow-chart-state FCS-8 a state-of-health trend analysis of an evolutionary course of the model parameter $z_{tp}$ being determined by solving the optimization-/model parameter estimation-problem over numerous time periods tp is evaluated or done. The numerous time periods tp can have time durations being constant or variable.

As result of evaluating or doing the SOH-trend analysis of the model parameter $z_{tp}$ again the notification information NI for notifying about an increase of the battery-state-of-health more than expected or in case of battery operating safety risks is generated.

The actions from the fourth flow-chart-state FCS-4 to the eighth flow-chart-state FCS-8 are related to the involvement of the calculation engine CE as indicated in the FIG. 5.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements.

REFERENCE

[1] J. Meng, G. Luo, M. Ricco, M. Swierczynski, D.-I. Stroe, and R. Teodorescu, "Overview of lithium-ion battery modeling methods for state-of-charge estimation in electrical vehicles," Applied Sciences, vol. 8, no. 5, p. 659, 2018.

The invention claimed is:

1. A method for automatically estimating states-of-health of batteries storing electrical energy and generating notification information, comprising:
   a) collecting and storing direct current measurement data, direct voltage measurement data and temperature measurement data from a battery storing electrical energy due to battery measurements of battery-internal physical properties inter alia the measurement of a terminal direct current $I_{DC}$ as a first physical property, a terminal direct voltage $U_{DV}$ as a second physical property and a battery cell temperature T as a third physical property during a recurring, continuous, time interval (ti), at the most over a lifetime of the battery, wherein the collecting and storing is performed during normal operation of the battery,
   b) selecting a time period (tp) with tp≥n·ti, wherein n is a positive integer,
   c) executing a dynamical battery model for the time period, which relates to measurable model input sizes u, measurable model output sizes y, model states x and model parameter z and which is a time t discretized such that a model state $x_{t+1}$ is defined to a first function f with $x_{t+1}:=f_{tp}(x_t,u_t,z)$ and a model output size $y_t$ is defined to a second function g with $y_t:=g_{tp}(x_t,u_t,z)$, by accessing direct current evaluation data including direct current measurement data of the stored direct current measurement data relating to the measurable model input sizes u, direct voltage evaluation data including direct voltage measurement data of the stored direct voltage measurement data relating to the measurable model output sizes y and temperature evaluation data including temperature measurement data of the stored temperature measurement data relating to the measurable model input sizes u, solving an optimization-/model parameter estimation-problem given by the first function f, the second function g, the model input sizes u and the model output sizes y such that the solution of the problem yields a model parameter for the time period, minimizing a difference between the battery model and the battery measurements and enabling the indication of the battery-state-of-health due to the model parameter being constant for the selected time period, and d) evaluating or doing a state-of-health trend analysis of an evolutionary course of the model parameter being determined by solving the optimization-/model parameter estimation-problem over numerous time periods with constant or variable time durations e) generating notification information about an increase of the battery-state-of-health more than expected or in case of battery operating safety risks as a result of evaluating or doing the state-of-health trend analysis of the model parameter respectively the battery-internal resistance R and/or the battery-internal capacity C, and f) outputting the notification information.

2. The method according to claim 1, wherein an equivalent circuit model is used as the battery model; the model input sizes u depending on a "the time t"-dependent terminal direct current $I_{DC}(t)$ and the battery cell temperature T with $u=[I_{DC}(t), T, \ldots]$, the model output sizes y depending on a "the time t"-dependent terminal direct voltage $U_{DV}(t)$ with $y=[U_{DV}(t), \ldots]$, the model states x depending on a "the time t"-dependent state-of-charge SOC with $x=[SOC(t), \ldots]$ and the model parameter z depending on an open circuit voltage $U_{OC}$ being dependent on a "the time t"-dependent state-of-charge SOC(t), depending on a battery-internal resistance R and depending on a battery-internal capacity C with $z=[U_{OC}(SOC(t)), C, R, \ldots]$ and $C=C1+C2$; $R=R_0+R_1+R_2$ being related to and the optimization-/model parameter estimation-problem with regard to the model parameter and the time period is solved according to the formulas $$\text{Error}(z)=\text{mean}[(Y_{tp,BMO}(g_{tp},U_{tp,BME})-Y_{tp,BME})^2] \text{ and}$$

$$z_{tp}=\text{argmin}_z[\text{Error}(z)] \text{ with}$$

$$Y_{tp,BME}[ED_{DV,tp}]:=\{y_{1,BME}[MD_{DV,ti=1}:=U_{DV,ti=1}(t)],\\ y_{2,BME}[MD_{DV,ti=2}:=U_{DV,ti=2}(t)], \ldots y_{n,BME}\\ [MD_{DV,ti=n}:=U_{DV,ti=n}(t)]\}$$

$$U_{tp,BME}[ED_{DC,tp},ED_{T,tp}]:=\{u_{1,BME}[MD_{DC,ti=1}:=\\ I_{DC,ti=1}(t),MD_{T,ti=1}:=T_{ti=1}],u_{2,BME}\\ [MD_{DC,ti=2}:=I_{DC,ti=2}(t),MD_{T,ti=2}:=T_{ti=2}], \ldots\\ u_{n,BME}[MD_{DC,ti=n}:=I_{DC,ti=n}(t),MD_{T,ti=n}:=T_{ti=n}]\}$$

$$Y_{tp,BMO}(g_{tp},U_{tp,BME}[ED_{DC,tp},ED_{T,tp}]):=\{y_{1,BMO}g_{ti=1}\\ (x_0,u_{1,BME}[MD_{DC,ti=1}:=I_{DC,ti=1}(t),\\ MD_{T,ti=1}:=T_{ti=1}],z),y_{2,BMO}:=g_{ti=2}(x_1,u_{2,BME}\\ [MD_{DC,ti=2}:=I_{DC,ti=2}(t),MD_{T,ti=2}:=T_{ti=2}],z), \ldots\\ y_{n,BMO}:=g_{ti=1}(x_{n-1},u_{n,BME}[MD_{DC,ti=n}:=\\ I_{DC,ti=n}(t),MD_{T,ti=n}:=T_{ti=n}],z)\}.$$

3. The method according to claim 2, wherein to solve the optimization-/model parameter estimation-problem of the equivalent circuit model with regard to the model parameter a parameter ambiguity due to a dependency of the model parameter z on the open circuit voltage $U_{OC}$ and the battery-internal capacity C for determining the "the time t"-dependent state-of-charge SOC(t) is eliminated by calibrating the open circuit voltage $U_{OC}$ and the state-of-charge SOC(t) as a result of considering a defined value of the capacity C, in particular a known value of the capacity C, into the solution of the optimization-/model parameter estimation-problem.

4. The method according to claim 1, further comprising replacing a battery cell and/or battery module based on the state-of-health trend analysis.

5. The method according to claim 1, wherein the notification information is generated when the battery-internal capacity C decreases below a threshold and/or when the internal battery-internal resistance R increases above a threshold.

6. A computer-implemented tool, for automatically estimating states-of-health of batteries storing electrical energy, wherein a) from a battery storing electrical energy due to battery measurements of battery-internal physical properties inter alia the measurement of a terminal direct current $I_{DC}$ as a first physical property, a terminal direct voltage $U_{DV}$ as a second physical property and a battery cell temperature T as a third physical property during a recurring, in particular continuous, time interval (ti), in particular at the most over a lifetime of the battery, direct current measurement data, direct voltage measurement data and temperature measurement data are collected and stored, wherein the data is collected and stored during operation of the battery and does not require a specific test performed outside of normal operation of the battery, wherein:

a non-transitory, processor-readable storage medium having processor-readable program-instructions of a program module for automatically estimating a state-of-health of the battery stored in the non-transitory, processor-readable storage medium and a processor connected with the storage medium executing the processor-readable program-instructions of the program module to estimate the state-of-health, wherein the program module and the processor form a calculation engine such that:

b) a time period (tp) with tp≥n·ti, wherein n is a positive integer is selected, c) a dynamical battery model for the time period, which relates to measurable model input sizes u, measurable model output sizes y, model states x and model parameter z and which is a time t discretized such that a model state $x_{t+1}$ is defined to a first function f with $x_{t+1}:=f_{tp}(x_t,u_t,z)$ and a model output size $y_t$ is defined to a second function g with $y_t:=g_{tp}(x_t,u_t,z)$, is executed by accessing to direct current evaluation data including direct current measurement data of the stored direct current measurement data relating to the measurable model input sizes u, direct voltage evaluation data including direct voltage measurement data of the stored direct voltage measurement data relating to the measurable model output sizes y and temperature evaluation data including temperature measurement data of the stored temperature measurement data relating to the measurable model input sizes u, solving an optimization-/model parameter estimation-problem given by the first function f, the second function g, the model input sizes u and the model output sizes y such that the solution of the problem yields a model parameter for the time period minimizing a difference between the battery model and the battery measurements and enabling the indication of the battery-state-of-health due to the model parameter being constant for the selected time period, d) a state-of-health trend analysis of an evolutionary course of the model parameter being determined by solving the optimization-/model parameter estimation-problem over numerous time periods with constant or variable time durations is evaluated or done, and e) a notification information for notifying about an increase of the battery-state-of-health more than expected or in case of battery operating safety risks is generated as result of evaluating or doing the state-ofhealth trend analysis of the model parameter respectively a battery-internal resistance R and/or a battery-internal capacity C.

7. The computer-implemented tool according to claim 6, wherein an equivalent circuit model is used as the battery model;
the model input sizes u depending on a "the time t"-dependent terminal direct current $I_{DC}(t)$ and the battery cell temperature T with $u=[I_{DC}(t), T, \ldots]$, the model output sizes y depending on a "the time t"-dependent terminal direct voltage $U_{DV}(t)$ with $y=[U_{DV}(t), \ldots]$, the model states x depending on a "the time t"-dependent state-of-charge SOC with $x=[SOC(t), \ldots]$ and the model parameter z depending on an open circuit voltage Uoc being dependent on a "the time t"-dependent state-of-charge SOC(t), depending on a battery-internal resistance R and depending on a battery-internal capacity C with $z=[U_{OC}(SOC(t)), C, R, \ldots]$ and $C=C1+C2$; $R=R_0+R_1+R_2$ being related to and
the optimization-/model parameter estimation-problem with regard to the model parameter and the time period is solved according to the formulas Error(z)=mean[$(Y_{tp,BMO}(g_{tp},U_{tp,BME})-Y_{tp,BME})^2$] and $z_{tp}$=argmin$_z$[Error(z)] with $Y_{tp,BME}[ED_{DV,tp}]:=\{y_{1,BME}[MD_{DV,ti=1}:=U_{DV,ti=1}(t)],$
$y_{2,BME}[MD_{DV,ti=2}:=U_{DV,ti=2}(t)], \ldots y_{n,BME}$
$[MD_{DV,ti=n}:=U_{DV,ti=n}(t)]\}$ $U_{tp,BME}[ED_{DC,tp},ED_{T,tp}]:=\{u_{1,BME}[MD_{DC,ti=1}:=$
$I_{DC,ti=1}(t),MD_{T,ti=1}:=T_{ti=1}],u_{2,BME}$
$[MD_{DC,ti=2}:=I_{DC,ti=2}(t),MD_{T,ti=2}:=T_{ti=2}], \ldots$
$u_{n,BME}[MD_{DC,ti=n}:=I_{DC,ti=n}(t),MD_{T,ti=n}:=T_{ti=n}]\}$ $Y_{tp,BMO}(g_{tp},U_{tp,BME}[ED_{DC,tp},ED_{T,tp}]):=\{y_{1,BMO}:=g_{ti=1}$
$(x_0,u_{1,BME}[MD_{DC,ti=1}:=I_{DC,ti=1}(t),$
$MD_{T,ti=1}:=T_{ti=1}],z),y_{2,BMO}:=g_{ti=2}(x_1,u_{2,BME}$
$[MD_{DC,ti=2}:=I_{DC,ti=2}(t),MD_{T,ti=2}:=T_{ti=2}],z), \ldots$
$y_{n,BMO}:=g_{ti=1}(x_{n-1},u_{n,BME}[MD_{DC,ti=n}:=I_{DC,ti=n}(t),$
$MD_{T,ti=n}:=T_{ti=n}],z)\}$.

8. The computer-implemented tool according to claim 7, wherein the calculation engine is designed such that to solve the optimization-/model parameter estimation-problem of the equivalent circuit model with regard to the model parameter a parameter ambiguity due to a dependency of the model parameter z on the open circuit voltage $U_{OC}$ and the battery-internal capacity C for determining the "the time t"-dependent state-of-charge SOC(t) is eliminated by calibrating the open circuit voltage $U_{OC}$ and the state-of-charge SOC(t) as a result of considering a defined value of the capacity C, in particular a known value of the capacity C, into the solution of the optimization-/model parameter estimation-problem.

9. The computer-implemented tool according to claim 6, wherein a replacement of battery cells and/or battery modules is prepared based on the state-of-health trend analysis.

10. A battery management system for automatically estimating states of health of batteries storing electrical energy with a battery management unit connected to a battery for controlling the battery,
wherein
the computer-implemented tool according to claim 6 either being implemented as a sub-unit in the battery management unit or forming a functional unit with the battery management unit, such that the computer-implemented tool is uploadable into the battery management unit or forms either a cloud-based, centralized platform for the battery management system or a decentralized platform for the battery management system, for carrying out a method.

11. A battery energy storage system including
a database, in particular a data cloud, which on the input side is connected to a battery storing electrical energy, wherein
the battery management system for automatically estimating states of health of batteries storing electrical energy according to claim 10, which is assigned to the database and forms a functional unit with the database.

12. The computer-implemented tool according to claim 6, wherein the notification information is generated when the battery-internal capacity C decreases below a threshold and/or when the internal battery-internal resistance R increases above a threshold.

* * * * *